(12) United States Patent
Fäcke et al.

(10) Patent No.: US 7,381,764 B2
(45) Date of Patent: Jun. 3, 2008

(54) RADIATION-CURING BINDERS CONTAINING CARBOXYLIC ACID ESTERS

(75) Inventors: Thomas Fäcke, Bridgeville, PA (US); Jan Weikard, Odenthal (DE); Peter Thometzek, Stuttgart (DE)

(73) Assignee: Bayer MaterialScience AG, Leverkusen (DE)

( * ) Notice: Subject to any disclaimer, the term of this patent is extended or adjusted under 35 U.S.C. 154(b) by 653 days.

(21) Appl. No.: 10/959,853

(22) Filed: Oct. 6, 2004

(65) Prior Publication Data

US 2005/0080174 A1      Apr. 14, 2005

(30) Foreign Application Priority Data

Oct. 10, 2003    (DE) .................................. 103 47 087

(51) Int. Cl.
*C08K 5/10*    (2006.01)
*C08L 67/06*    (2006.01)

(52) U.S. Cl. ...................... 524/306; 524/904; 523/504; 525/934

(58) Field of Classification Search ................ 523/504; 524/904, 306; 525/934
See application file for complete search history.

(56) References Cited

U.S. PATENT DOCUMENTS

| 5,068,305 | A | 11/1991 | Meixner et al. | 528/49 |
| 6,136,882 | A * | 10/2000 | Daly et al. | 522/107 |
| 6,555,597 | B1 | 4/2003 | Weikard et al. | 522/174 |
| 6,809,126 | B2 | 10/2004 | Fäcke et al. | 522/90 |
| 2003/0134125 | A1 | 7/2003 | Facke et al. | 428/423.1 |

FOREIGN PATENT DOCUMENTS

| EP | 0 464 279 A1 | 1/1992 |
| WO | 03/068878 A2 | 8/2003 |

OTHER PUBLICATIONS

An introduction to Polymer Science, Hans-Georg Elias, VCH Verlagsgesellschaft, Weinheim, (month unavailable) 1997, chapter 10.2.4., "Moduli and Poisson Ratio", pp. 330-332.

* cited by examiner

*Primary Examiner*—Tae H Yoon
(74) *Attorney, Agent, or Firm*—Noland J. Cheung; Robert S. Klemz

(57) ABSTRACT

The present invention relates to novel radiation-curing powder coating binders containing maleic and/or fumaric acid esters and one or more amorphous or partially crystalline resins containing at least one group that reacts with ethylenically unsaturated compounds under the action of actinic radiation to form a polymer. The binders have a glass transition temperature ranging from 30 to 90° C. The binders can be used as a constituent in coating compositions.

18 Claims, No Drawings

RADIATION-CURING BINDERS CONTAINING CARBOXYLIC ACID ESTERS

CROSS REFERENCE TO RELATED PATENT APPLICATION

The present patent application claims the right of priority under 35 U.S.C. §119 (a)-(d) of German Patent Application No.103 47 087.5, filed Oct. 10, 2003.

BACKGROUND OF THE INVENTION

1. Field of the Invention

The present invention relates to novel radiation-curing powder coating binders containing maleic and/or fumaric acid esters and to the use of these binders as a constituent of coating compositions.

2. Description of the Prior Art

The use of radiation-curing pulverulent binders offers the inherent advantage over heat-curing powders that flow and curing are separately controllable. It is therefore conventional firstly to melt the applied powder coating and allow sufficient time to enable the desired flow, and then to cure the coating by means of energy-rich actinic radiation.

To be able to coat temperature-sensitive substrates as well, the melting step should be carried out at the lowest possible temperatures ($\leq 120°$ C.) for the shortest possible time in order to assure a good flow of the coating composition and so as not to damage the substrate.

Radiation-curing binders are based on the chemical systems known in powder coating chemistry, such as polyesters carrying acrylic groups or polyacrylates. Urethane acrylates are used for particularly high-quality coatings.

Whereas EP-A 410 242 describes the preparation of such binders in organic solvents, DE 199 398 43 teaches the solventless preparation thereof using a high proportion of 10-95 wt. % of a crystalline component synthesized from a monoisocyanate or diisocyanate and a monohydroxyalkyl (meth)acrylate.

Although very good coating properties have been obtained, the storage stability of these powder coatings is poor. The powder cakes in the grinding and sieving process, so industrial use is only possible at cooled ambient temperatures that are not practical.

WO-A 03 044 111 describes storage-resistant, pulverulent amorphous urethane acrylates which can be ground at room temperature, have no tendency to cake and have a particularly low viscosity after melting. The glass transition temperatures of these compounds are above 45° C. To obtain a good flow of the powder coating binders described, it is necessary to use melting temperatures above 120° C., which are too high for some important substrates such as certain plastics and types of wood.

The object of the invention was therefore to improve the known radiation-curing powder coating systems so that satisfactory flow properties are achieved even at melting temperatures of $\leq 120°$ C. without grindability and storage stability being adversely affected.

SUMMARY OF THE INVENTION

The present invention is directed to binder compositions having a glass transition temperature ($T_g$) within the range of from 30 to 90° C. inclusive, and includes A) one or more crystalline maleic and/or fumaric acid esters, and B) one or more amorphous or partially crystalline resins containing at least one group that reacts with ethylenically unsaturated compounds under the action of actinic radiation to form a polymer.

The present invention is also directed to a method of making a coating composition that includes combining the above-described binder composition with one or more auxiliary substances or additives selected from initiators activatable by actinic radiation, photoinitiators activated by UV or visible light, organic peroxy compounds, inorganic peroxides, azo compounds, UV absorbers, sterically hindered amines (HALS), antioxidants, fillers antisettling agents, defoaming agents, wetting agents, flow control agents, reactive thinners, plasticizers, catalysts, thickeners, pigments, dyestuffs and matting agents.

The present invention is also directed to coatings obtained from the above-described binder compositions as well as to substrates coated with the coatings.

DETAILED DESCRIPTION OF THE INVENTION

Other than in the operating examples, or where otherwise indicated, all numbers or expressions referring to quantities of ingredients, reaction conditions, etc. used in the specification and claims are to be understood as modified in all instances by the term "about."

It has now been found that storage-resistant powder coatings with the desired melting behaviour, which have a good grindability at room temperature, are obtained by adding monomeric maleic and/or fumaric acid esters to the radiation-curing powder coating.

The invention provides binder compositions with a glass transition temperature $T_g$ within the range from 30 to 90° C. inclusive, comprising A) one or more crystalline maleic and/or fumaric acid esters, B) one or more amorphous or partially crystalline resins containing at least one group that reacts with ethylenically unsaturated compounds under the action of actinic radiation to form a polymer, and C) optionally auxiliary substances or additives.

Actinic radiation is understood as meaning electromagnetic ionizing radiation, especially electron beams, UV rays and visible light (Roche Lexikon Medizin, 4th edition; Urban & Fischer Verlag, Munich 1999).

In terms of the present invention, melting point denotes the temperature at which the crystalline fumaric or maleic acid ester (component A) melts at an atmospheric pressure of 1 bar. By contrast, amorphous resins (e.g. those in component B) have no definite melting point. Amorphous resins can have various characteristic temperatures assigned to them at which the properties of the material change. One of these temperatures is the glass transition temperature $T_{(g)}$, which describes the transition from the solid state to a rubbery/viscous state. In the case of semicrystalline resins (such as are also used in component B), it is possible to assign both a glass transition temperature $T_g$ and a melting point. The latter is always higher than the former. A detailed description can be found in H.-G. Elias, "An Introduction to Polymer Science", VCH Verlagsgesellschaft, Weinheim, 1997, chapter 10.2.4., 'Moduli and Poisson Ratios', pages 330-332.

The maleic or fumaric acid esters ROOC—CH=CH—COOR' used in A) can be either the half-esters or the full esters, individually or in any desired mixtures with one another. They preferably have a melting point within the range of 20-180° C., preferably 40-140° C. and particularly preferably 80-135° C. inclusive.

In said formula R is an optionally unsaturated aliphatic, cycloaliphatic, araliphatic or aromatic radical optionally containing heteroatoms and R' is either H or likewise an optionally unsaturated aliphatic, cycloaliphatic, araliphatic or aromatic radical optionally containing heteroatoms.

In principle, R and R' can also contain functional groups such as vinyl, allyl, epoxy, cyano, isocyanato, amino, thiol, hydroxyl, halogen, nitro, sulfone, sulfoxy, amide, ether, ester, carboxylic acid, urea, urethane, uretdione, allophanate, biuret, isocyanurate, thioester, thioamide, carboxyl, carbonyl, aryl and/or acyl groups.

R is preferably methyl, ethyl, n-propyl, isopropyl, n-butyl, isobutyl, tert-butyl, pentyl, hexyl, heptyl, octyl, nonyl, decyl, dodecyl, cycloheptyl or cyclohexyl, particularly preferably ethyl, isopropyl, n-butyl or cyclohexyl.

The following are particularly preferably used: fumaric acid dialkyl esters R—OOC—CH$_2$=CH$_2$—COOR' where R=R'=methyl, cyclohexyl or dodecyl; fumaric acid half-esters R—OOC—CH$_2$=CH$_2$—COOH where R=methyl, ethyl, isopropyl, cyclohexyl, allyl, dodecyl, propargyl or butyl; maleic acid dialkyl esters R—OOC—CH$_2$=CH$_2$—COOR' where R=R'=cyclohexyl or dodecyl; or maleic acid half-esters R—OOC—CH$_2$=CH$_2$—COOH where R=ethyl, isopropyl, cyclohexyl or dodecyl.

It is very particularly preferable to use exclusively the fumaric acid esters, especially the fumaric acid half-esters, of the above-mentioned type in A).

The maleic or fumaric acid esters contained in the binder compositions according to the invention are readily available industrially according to EP-A 69 926 by reaction of maleic anhydride with the appropriate alcohol or mixtures of alcohols, optionally followed by isomerization.

Component B) contains one or more amorphous or partially crystalline resins that contain at least one group polymerizable under the action of actinic radiation. Examples of such resins are polyesters, polycarbonates, polyacrylates, polyethers, polyurethanes, polyamides or any desired mixtures of such polymers that contain at least one group polymerizable under the action of actinic radiation.

Examples of possible groups polymerizable by actinic radiation are vinyl, vinyl ether, propenyl, allyl, maleinyl, fumaryl, maleimide, dicyclopentadienyl, acrylamide, acrylic and methacrylic groups, vinyl ether, acrylic and/or methacrylic groups being preferred and acrylic groups being particularly preferred.

Suitable polyesters or polyamides are conventionally obtained by reacting unsaturated acids or anhydrides, such as maleic acid (anhydride) and fumaric acid, with compounds containing several OH and/or NH groups.

Suitable polyesters, polycarbonates or polyurethanes are obtainable e.g. by reacting unsaturated compounds having 2 to 12 carbon atoms, preferably 2 to 4 carbon atoms, and containing OH groups with e.g. polyesters or polycarbonates containing acid, ester or acid chloride groups or polyurethanes containing NCO groups.

Examples of suitable unsaturated compounds containing OH groups are hydroxyethyl (meth)acrylate, 2- and 3-hydroxypropyl (meth)acrylate and 2-, 3- and 4-hydroxybutyl (meth)acrylate, as well as vinyl ethers containing OH groups, e.g. hydroxybutyl vinyl ether, and mixtures thereof.

Other unsaturated compounds containing OH groups which can be used are (meth)acrylic acid esters or amides containing OH groups, which are obtainable by reacting up to n-1 equivalents of (meth)acrylic acid with n-hydric alcohols, amines, amino alcohols and/or mixtures thereof. Suitable n-hydric alcohols are glycerol, trimethylolpropane and/or pentaerythritol.

It is also possible to use products resulting from the reaction of (meth)acrylic acid esters containing epoxy groups with (meth)acrylic acid. Thus the reaction of glycidyl methacrylate with acrylic acid gives a mixed acrylic acid/methacrylic acid ester of glycerol, which can also be used to advantage.

Reaction products of polyesters with acid numbers of >5 and (meth)acrylates containing glycidyl groups (e.g. glycidyl methacrylate) are also suitable.

Preferred unsaturated compounds containing OH groups for the synthesis of unsaturated polyesters, polycarbonates and polyurethanes are hydroxyethyl acrylate and the isomeric hydroxypropyl acrylates.

Polyacrylates can be modified by radiation curing only after polymerization of the acrylate and vinylaromatic monomers. This is effected via functional groups which are inert to the conditions of preparation of the polyacrylate and only then are further modified to give unsaturated radiation-curing groups. The following are examples of groups suitable for this purpose:

| Inert group | Modifying reagent | Radiation-curing group |
|---|---|---|
| epoxy | acrylic acid, dimeric acrylic acid | acrylate |
| acid | glycidyl methacrylate | methacrylate |
| acid | hydroxyalkyl acrylate | acrylate |
| alcohol | maleic anhydride | maleate |
| alcohol | acrylic acid, dimeric acrylic acid | acrylate |
| alcohol | isocyanate with acrylic groups | urethane acrylate |
| isocyanate | hydroxyalkyl acrylate | urethane acrylate |
| anhydride | hydroxyalkyl acrylate | acrylate |

Various amorphous or partially crystalline resins that contain at least one group polymerizable under the action of actinic radiation are also commercially available, examples being the products of the UVECOAT® series from UCB S.A., BE, and the products of the URACROSS® P series from DSM N.V., NL.

Additives or auxiliary substances conventionally used in the technology of lacquers, paints, printing inks, sealants and adhesives can be present as component C). These also include initiators activatable by actinic radiation, which trigger free radical polymerization of the appropriate polymerizable groups. Photoinitiators, which are activated by UV or visible light, are preferred here. Photoinitiators are commercially available compounds known per se and are subdivided into unimolecular initiators (type I) and bimolecular initiators (type II). Examples of suitable (type I) systems are aromatic ketone compounds, e.g. benzophenones in combination with tertiary amines, alkylbenzophenones, 4,4'-bis(dimethyl-amino)benzophenone (Michler's ketone), anthrone and halogenated benzophenones, or mixtures of said types. (Type II) initiators are also suitable, examples being benzoin and its derivatives, benzilketals, acylphosphine oxides, e.g. 2,4,6-trimethylbenzoyldiphenylphosphine oxide, bisacylphosphine oxides, phenylglyoxylic acid esters, camphorquinone, α-aminoalkylphenones, α,α-dialkoxyacetophenones and α-hydroxyalkylphenones. Mixtures of these compounds can also be used. Preferred compounds are those which can be incorporated well by the methods of powder coating technology and do not reduce the storage stability or grindability of the binders. Examples of said compounds are 1-hydroxycyclohexyl phenyl ketone, benzidimethylketal or—in the case of pigmented systems—2-methyl-1-(4-(methylthio)phenyl-2-morpholino)-1-propanone or trimethylbenzoyldiphenylphosphine oxide.

If the curing of the polymerizable constituents is additionally to be initiated thermally, suitable compounds of component C are peroxy compounds such as diacyl peroxides, e.g. benzoyl peroxide, an alkyl hydroperoxide such as diisopropylbenzene monohydroperoxide, alkyl per esters such as tert-butyl perbenzoate, dialkyl peroxides such as ditert-butyl peroxide, peroxydicarbonates such as dicetyl peroxydicarbonate, inorganic peroxides such as ammonium peroxodisulfate or potassium peroxodisulfate, or azo compounds such as 2,2'-azobis[N-(2-propenyl)-2-methylpropionamides], 1-[(cyano-1-methyl-ethyl)azo]formamides,2,2'-azobis(N-butyl-2-methylpropionamides), 2,2'-azobis(N-cyclohexyl-2-methylpropionamides), 2,2'-azobis {2-methyl-N-[2-(1-hydroxybutyl)]propionamides}, 2,2'-azobis {2-methyl-N-[2-(1-hydroxybutyl)]-propionamides} or 2,2'-azobis{2-methyl-N-[1,1-bis(hydroxymethyl)-2-hydroxyethyl]propionamides}, as well as benzpinacol. These free radical producers can be combined in known manner with accelerators, e.g. cobalt compounds and/or aromatic amines.

Further additives which can be used are stabilizers, light stabilizers such as UV absorbers and sterically hindered amines (HALS), antioxidants, fillers and lacquer auxiliaries, e.g. antisettling agents, defoaming agents and/or wetting agents, flow control agents, reactive thinners, plasticizers, catalysts and/or thickeners, as well as pigments, dyestuffs and/or matting agents. The use of light stabilizers and the various types are described for example in A. Valet, Lichtschutzmittel für Lacke, Vincentz Verlag, Hannover, 1996.

The invention also provides a process for the preparation of the binder compositions according to the invention, wherein components A) to C) are mixed together in any desired order or as a mixture, by stirring, kneading or some other form of mixing, at temperatures of 40 to 140° C., preferably 60 to 120° C., and finally comminuted to granules.

Examples of suitable mixers are extruders or kneaders, extruders being preferred.

The extrusion conditions correspond to a temperature range in which the constituents of component B) are already soft, i.e. above the glass transition temperature $T_g$ of B), but still below the melting point $T_m$ of component A). Extrusion conditions above the melting point $T_m$ of A) are also possible, but only when recrystallization of the esters A) from the mixture takes place after extrusion. A further possibility is to dispense with a common extrusion and to grind and sieve A) and B) separately from one another and simply mix the powders.

Component C) can be added to either of components A) and B) prior to mixing or to both components A) and B) during or after mixing.

The granulation is carried out in a manner known per se, for example by grinding and then sieving to remove coarse or excessively fine particle fractions. After grinding, the binder compositions preferably have a mean particle size of less than 200 μm, particularly preferably less than 100 μm.

The pulverulent binder compositions prepared in this way can be applied to the mouldings to be coated by conventional powder application processes, e.g. electrostatic powder spraying, turboelectric application, electromagnetic brushing or fluidized bed coating. The coatings are then initially melted by the action of heat (e.g. using IR radiators and/or in circulating air or convection ovens). A clear film forms, unless pigments or the like have been incorporated. The coatings can be cured either by heating at 130-220° C., preferably 150-190° C., and/or by the action of energy-rich radiation such as UV radiation or an electron beam. In the latter, preferred case, only a low temperature is required for melting. This is preferably $\leq 120°$ C., particularly preferably $\leq 100°$ C. and very particularly preferably $\leq 90°$ C., the melting time being preferably $\leq 20$ min, particularly preferably $\leq 15$ min and very particularly preferably $\leq 10$ min.

In the case of crosslinking by means of UV radiation, photoinitiators have to be incorporated homogeneously into component C). Suitable photoinitiators are the compounds that are conventionally used, provided that they do not have an adverse effect on the powder properties such as flowability and storability.

The photoinitiators mentioned in C), which are used in amounts of between 0.1 and 10 wt. %, preferably 0.1 to 5 wt. %, based on the weight of the binder, can be used as individual substances or, since advantageous synergistic effects are frequently observed, they can be used in combination with one another.

The invention also provides the use of the powder coating binders prepared according to the invention for the coating of substrates made of wood, metal, plastic or mineral substances, already coated substrates, or substrates consisting of any desired combinations of said materials. Uses which may be mentioned in particular here are in the industrial lacquering of MDF boards or preassembled high-quality goods already containing temperature-sensitive components, and also the lacquering of furniture, coils, everyday articles, motor vehicle bodies and their add-on parts. Composite materials made up of plastic and metal are also suitable substrates.

Especially on metal or plastic parts, the use of esters A) still containing free carboxylate groups can result in particularly good adhesion.

EXAMPLES

In the Examples which follow, all percentages are by weight.

The glass transition temperature $T_g$ was determined with a differential scanning calorimeter (DSC 12E, Mettler-Toledo GmbH, Giessen, Del.) over a temperature range from −15° C. to +150° C. (heating rate: 10 K/minute).

The indicated melting points in ° C. were determined with a capillary melting point apparatus (Büchi 530, Büchi Labortechnik AG, CH-9230 Flawil).

The NCO content was determined by titration according to DIN 53 185.

Example 1

Amorphous Urethane Acrylate Resin 2425.70 g of Desmodur I [1-isocyanato-3-isocyanatomethyl-3,5,5-trimethylcyclo-hexane (IPDI)] (Bayer AG, Leverkusen, DE) were placed in a flat-flange pot and 1.60 g of 2,5-ditert-butylhydroquinone, 4.00 g of 2,6-ditert-butyl-4-methylphenol, 2.00 g of Desmorapid Z (dibutyltin dilaurate) (Bayer AG, Leverkusen, DE) and 4.00 g of p-methoxyphenol were dissolved in it at 90° C. A mixture of 1179.24 g of hydroxypropyl acrylate and 383.46 g of 1,2-ethanediol was then metered in over 3 h with the evolution of heat, the temperature being kept at 90° C. As the viscosity of the resin melt increased, it was heated to 116° C. After stirring for 1.5 h, the NCO content had reached 0.05 wt. %. The melt was transferred to an aluminium dish and left to cool. The glass transition temperature $T_g$ of the amorphous, glass-hard, brittle product was 49.2° C.

Example 2

Crystalline Monomeric Monocyclohexyl Fumarate 200 g of cyclohexanol were added dropwise at 160° C. over 50 minutes to a solution of 196 g of maleic anhydride and 2 g of iodine in 200 g of a technical-grade alkylaromatic mixture as solvent. The reaction mixture was filtered hot and evaporated under a water-jet vacuum and the residue was recrystallized from light gasoline/toluene to give monocyclohexyl fumarate in the form of colourless crystals with a melting point $T_m$ of 87° C.

Example 3

Production of the Coatings

The product of Example 1 (component B) was processed with a CA 80 a-2 chopper from Alpine, Augsburg, DE. The chopped component B) and the fumaric acid ester of Example 2 (component A) were separately ground on an ICM 4 mill from Neumann & Esser GmbH, Übach-Palenberg, DE (pneumatic classifier: 20 m/s, rotor: 80 m/s) and passed through a 120 μm sieve. 91.25 wt. % of the comminuted component B), 7.00% of the comminuted component A), 1.0 wt. % of Worlee Add 101 (Worlee-Chemie GmbH, Lauenburg, DE) as flow control agent and 0.75 wt. % of Irgacuree®2959 photoinitiator (Ciba Specialty Chemicals Inc., Basle, CH) were weighed out in a premix vessel and premixed in a Prism Pilot 3 premixer from Prism Ltd., Lichfield, Staffordshire, UK (premixer settings: 20 s, 1200 rpm). The mixture was then extruded in an APV MP19-1SPC extruder from APV Baker Ltd., Newcastle-under-Lyme, Staffordshire, UK, with the following parameters: set temperature of zone 1:35° C./set temperature of zone 2:40° C./speed of rotation of shafts: 150 rpm/measured temperature of melt: 53° C./metering rate setting: 5.0/average load on extruder: 55%. The resulting chips were ground on an ICM 4 mill from Neumann & Esser, Übach-Palenberg, DE (pneumatic classifier: 20 m/s, rotor: 80 m/s), passed through a 120 μm sieve and immediately sprayed with an ITW Gema, spray gun from ITW Gema AG, St. Gallen, CH (50-60 mV, variable pressure, variable metering rate), onto grey-coated coil coating sheet (coil coating sheet, grey, 100×200 mm, Zanders, Solingen, DE). The film was melted in a circulating air oven, as indicated in Table 1, and the hot coil coating sheet was then irradiated with UV light using an IST S131P-7FO apparatus from Weiner & Pfleicherer-Hildebrand Strahlentechnik GmbH, Oberbohlingen, DE (CK normal 2, belt speed: 10 m/min). The film hardened immediately and was assessed after cooling to room temperature and storage for 60 min. The solvent resistance was assessed using a wad of cotton wool soaked in acetone, which was moved over the film for 100 up-and-down strokes under a contact pressure of approx. 1 kg. The gloss was measured according to DIN 67 530 at angles of 60 and 85° with a micro-TRI gloss meter from BYK-Gardner GmbH, 82538 Geretsried, DE.

The films are solvent-resistant and scratch-resistant and have the flow and gloss properties indicated in Table 1.

TABLE 1

Coating experiments

| Exp. | Time/min | Temp./° C. | Layer/μm | Gloss 60°/85° | Flow | Acetone |
|---|---|---|---|---|---|---|
| 1 | 5 | 100 | 66-103 | 83.5/95.5 | good | 0 |
| 2 | 10 | 100 | 53-65 | 83.2/97.1 | good | 0 |
| 3 | 10 | 90 | 61-83 | 88.1/92.5 | good | 0 |
| 4 | 15 | 80 | 62-92 | 87.9/91.7 | good | 0 |
| 5 | 5 | 120 | 66-80 | 90.0/101.1 | very good | 0 |

The coating experiments show that the coating compositions according to the invention flow to form high-gloss coatings of high surface quality, even at 80° C.

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

What is claimed is:

1. Binder compositions having a glass transition temperature ($T_g$) within the range of from 30 to 90° C. inclusive, comprising
    A) one or more crystalline maleic and/or fumaric acid esters, and
    B) one or more amorphous or partially crystalline resins containing at least one group that reacts with ethylenically unsaturated compounds under the action of actinic radiation to form a polymer.

2. Binder compositions according to claim 1, wherein component A) has a melting point within the range 20-180° C. inclusive.

3. Binder compositions according to claim 1, wherein component A) contains at least one maleic or fumaric acid half-ester.

4. Binder compositions according to claim 2, wherein component A) contains at least one maleic or fumaric acid half-ester.

5. A method of making a coating composition comprising combining the binder compositions according to claim 1 with one or more auxiliary substances or additives selected from the group consisting of initiators activatable by actinic radiation, photoinitiators activated by UV or visible light, organic peroxy compounds, inorganic peroxides, azo compounds, UV absorbers, sterically hindered amines (HALS), antioxidants, fillers antisettling agents, defoaming agents, wetting agents, flow control agents, reactive thinners, plasticizers, catalysts, thickeners, pigments, dyestuffs and matting agents.

6. A method of making a coating composition comprising combining the binder compositions according to claim 2 with one or more auxiliary substances or additives selected from the group consisting of initiators activatable by actinic radiation, photoinitiators activated by UV or visible light, organic peroxy compounds, inorganic peroxides, azo compounds, UV absorbers, sterically hindered amines (HALS), antioxidants, fillers antisettling agents, defoaming agents, wetting agents, flow control agents, reactive thinners, plasticizers, catalysts, thickeners, pigments, dyestuffs and matting agents.

7. Coatings obtained from binder compositions according to claim 1.

8. Substrates coated with coatings according to claim 7.

9. The binder compositions according to claim 1 further comprising C) one or more auxiliary substances or additives selected from the group consisting of initiators activatable by actinic radiation, photoinitiators activated by UV or visible light, organic peroxy compounds, inorganic peroxides, azo compounds, UV absorbers, sterically hindered amines (HALS), antioxidants, fillers antisettling agents, defoaming agents, wetting agents, flow control agents, reactive thinners, plasticizers, catalysts, thickeners, pigments, dyestuffs and matting agents.

10. A process for the preparation of the binder compositions according to claim 9, wherein the constituents of components A) to C), optionally comminuted beforehand, are homogeneously mixed with one another in any desired order at temperatures of 40 to 140° C. and finally comminuted to granules.

11. The process according to claim 10, wherein choppers and/or mills are used for the comminution steps and the mixing is carried out by means of extruders.

12. A method of making a coating composition comprising combining the binder compositions according to claim 3 with one or more auxiliary substances or additives selected from the group consisting of initiators activatable by actinic radiation, photoinitiators activated by UV or visible light, organic peroxy compounds, inorganic peroxides, azo compounds, UV absorbers, sterically hindered amines (HALS), antioxidants, fillers antisettling agents, defoaming agents, wetting agents, flow control agents, reactive thinners, plasticizers, catalysts, thickeners, pigments, dyestuffs and matting agents.

13. Coatings obtained from binder compositions according to claim 2.

14. Substrates coated with coatings according to claim 13.

15. Coatings obtained from binder compositions according to claim 3.

16. Substrates coated with coatings according to claim 15.

17. Binder compositions according to claim 1, wherein component B) comprises one or more resins that contain at least one group polymerizable under the action of actinic radiation selected from the group consisting of polyesters, polycarbonates, polyacrylates, polyethers, polyurethanes, and polyamides.

18. Binder compositions according to claim 17, wherein the groups polymerizable under the action of actinic radiation are selected from the group consisting of vinyl, vinyl ether, propenyl, allyl, maleinyl, fumaryl, maleimide, dicyclopentadienyl, acrylamide, acrylic groups, and methacrylic groups.

* * * * *